US009293291B2

(12) United States Patent
Lee et al.

(10) Patent No.: US 9,293,291 B2
(45) Date of Patent: Mar. 22, 2016

(54) FLEXIBLE DISPLAY DEVICE MANUFACTURING METHOD AND CARRIER SUBSTRATE FOR THE METHOD

(71) Applicant: Samsung Display Co., Ltd., Yongin, Gyeonggi-do (KR)

(72) Inventors: Dong-Min Lee, Yongin (KR); Chang-Mo Park, Yongin (KR); Mu-Gyeom Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 62 days.

(21) Appl. No.: 13/773,277

(22) Filed: Feb. 21, 2013

(65) Prior Publication Data

US 2014/0065916 A1 Mar. 6, 2014

(30) Foreign Application Priority Data

Aug. 31, 2012 (KR) .......... 10-2012-0096796
Nov. 29, 2012 (KR) .......... 10-2012-0137337

(51) Int. Cl.

| | |
|---|---|
| *B32B 7/06* | (2006.01) |
| *B32B 38/10* | (2006.01) |
| *B32B 17/00* | (2006.01) |
| *H01J 9/20* | (2006.01) |
| *H01L 51/00* | (2006.01) |
| *B32B 17/06* | (2006.01) |
| *B32B 17/10* | (2006.01) |
| *H05K 3/00* | (2006.01) |
| *H05K 1/18* | (2006.01) |
| *H01L 51/52* | (2006.01) |

(52) U.S. Cl.
CPC .......... *H01J 9/20* (2013.01); *H01L 51/003* (2013.01); *B32B 7/06* (2013.01); *B32B 17/06* (2013.01); *B32B 17/10* (2013.01); *B32B 38/10* (2013.01); *H01L 51/5256* (2013.01); *H01L 2227/326* (2013.01); *H01L 2251/5338* (2013.01);

(Continued)

(58) Field of Classification Search
CPC .... B32B 7/06; B32B 2038/002; B32B 38/10; B32B 17/06; B32B 17/10; H05K 1/187; H05K 3/007; Y10T 156/1056; Y10T 156/1057; Y10T 156/1082
USPC .......... 156/701, 719, 230, 248, 249, 153, 156/272.8, 299, 268, 256; 445/23, 24, 25
See application file for complete search history.

(56) References Cited

U.S. PATENT DOCUMENTS 6,322,655 B1 * 11/2001 Casagrande .......... 156/257
6,951,502 B2   10/2005 Koike et al.

(Continued)

FOREIGN PATENT DOCUMENTS

| CN | 102636898 | * | 8/2012 | ........ G02F 1/133305 |
|---|---|---|---|---|
| JP | 2002-222628 A | | 8/2002 | |

(Continued)

*Primary Examiner* — Linda L Gray

(74) *Attorney, Agent, or Firm* — Knobbe, Martens, Olson & Bear, LLP

(57) ABSTRACT

A method of manufacturing a flexible display device and a carrier substrate for manufacturing the same are disclosed. In one aspect, the method includes preparing a first release area and a first attachment area around the first surface area on a first surface, attaching a base substrate to the first surface, and forming a display unit on the base substrate corresponding to the first release area of the carrier substrate. The method also includes cutting the area of the base substrate corresponding to the first release area of the carrier substrate so as to include the display unit, and separating the cut base substrate from the carrier substrate. Thus, the carrier substrate and the base substrate may be smoothly combined with each other and separated from each other without an additional mask deposition process. Also, damage to a product that may occur during combination and separation of the substrates may be much reduced.

12 Claims, 4 Drawing Sheets

(52) U.S. Cl.
CPC ........... *H01L2251/566* (2013.01); *H05K 1/187* (2013.01); *H05K 3/007* (2013.01); *Y10T 156/1056* (2015.01); *Y10T 156/1057* (2015.01); *Y10T 156/1082* (2015.01)

(56) References Cited

U.S. PATENT DOCUMENTS

| | | | |
|---|---|---|---|
| 6,954,031 | B2 | 10/2005 | Hashimoto et al. |
| 8,088,670 | B2 | 1/2012 | Akiyama et al. |
| 8,323,066 | B2 * | 12/2012 | Kim ................................ 445/25 |
| 2002/0192428 | A1 | 12/2002 | Sol et al. |
| 2006/0157862 | A1 | 7/2006 | Nishimura et al. |
| 2007/0213203 | A1 * | 9/2007 | Sompalli et al. .............. 502/101 |

FOREIGN PATENT DOCUMENTS

| | | |
|---|---|---|
| JP | 2004-111354 A | 4/2004 |
| JP | 2006-202884 A | 8/2006 |
| JP | 2008-288556 A | 11/2008 |
| KR | 10-2000-0049292 A | 7/2000 |
| KR | 10-2004-0084969 A | 10/2004 |
| KR | 10-2006-0034665 A | 4/2006 |

* cited by examiner

FLEXIBLE DISPLAY DEVICE MANUFACTURING METHOD AND CARRIER SUBSTRATE FOR THE METHOD

CROSS-REFERENCE TO RELATED PATENT APPLICATIONS

This application claims the benefit of Korean Patent Application Nos. 10-2012-0096796, filed on Aug. 31, 2012, and 10-2012-0137337, filed on Nov. 29, 2012, in the Korean Intellectual Property Office, the disclosure of which is incorporated herein in its entirety by reference.

BACKGROUND

1. Field of the Technology

The described technology relates to a method of manufacturing a flexible display device and a carrier substrate used for the method of manufacturing a flexible display device.

2. Description of the Related Technology

Much researches has been directed to display devices such as organic light-emitting diodes because the display devices are capable of being made thin and flexible due to their manufacturability and operational characteristics.

However, because such a thin and flexible substrate can be made so thin, handling of the substrate is difficult. Accordingly, a carrier substrate that is relatively thick is used to attach a relatively thin and detachable substrate. Then, a display unit is formed and the carrier substrate is separated later, thereby producing a thin and flexible display device.

Thus, a key point is to ensure that the carrier substrate is smoothly attached and separated with respect to the thin substrate, which may relate to production efficiency.

SUMMARY OF CERTAIN INVENTIVE ASPECTS

One inventive aspect is a method of manufacturing a flexible display device in which a combination and a separation between a base substrate and a carrier substrate may be smoothly performed without an additional mask deposition process, and the carrier substrate used for the method of manufacturing a flexible display device.

Another aspect is a method of manufacturing a flexible display device includes preparing a first release area and a first attachment area around the first release area on a first surface, attaching a base substrate to the first surface, forming a display unit on the base substrate corresponding to the first release area of the carrier substrate, cutting the area of the base substrate corresponding to the first release area of the carrier substrate to include the display unit, and separating the cut base substrate from the carrier substrate.

In some embodiments, the first release area may be formed by a sand-blast process.

Both of the base substrate and the carrier substrate may include a glass material having a surface roughness of about 0.2 nm to about 0.3 nm.

A surface roughness of the first release area may be about 0.15 μm to about 1.2 μm by the sand-blast process.

The attaching of the base substrate may include combining the carrier substrate and the base substrate by a van der Waals' force in the first attachment area, and combining the carrier substrate and the base substrate by inducing a Si—O covalent bond between the carrier substrate and the base substrate in the first attachment area through a thermal treatment.

After the base substrate is attached to the carrier substrate, the first release area may be in a non-combined state with the base substrate.

The method may further include forming and sealing the display unit.

In the cutting of the base substrate, the base substrate may be cut by irradiating a laser beam.

In the cutting of the base substrate, the base substrate may be cut such that an edge of the base substrate is spaced apart from a boundary of the first release area toward the center of the first release area.

The carrier substrate may include a second surface that is the opposite to the first surface, and a second release area corresponding to the first release area is formed on the second surface.

The second release area may be formed by a sand-blast process.

Surface roughness of the second release area and the first release area may be different from each other.

According to another aspect, a carrier substrate used for manufacturing a flexible display device includes a first surface and a second surface that is an opposite surface to the first surface, wherein the first surface comprises a first release area that is sand-blast processed and a first attachment area that is not sand-blast processed and is disposed around the first release area.

The carrier substrate may be formed of a glass material, wherein the first release area has a surface roughness of about 0.15 μm to about 1.2 μm and the first attachment area has a surface roughness of about 0.2 nm to about 0.3 nm A base substrate may be disposed on the first surface, the carrier substrate and the base substrate may be combined with each other in the first attachment area by a van der Waals' force and a Si—O covalent bond, and the first release area may not be combined with the base substrate.

A display unit may be formed on an area of the base substrate corresponding to the first release area, and the area of the base substrate corresponding to the first release area may be cut and separated in a subsequent process.

Each of the first release area and the first attachment area may be provided in plural numbers.

A second release area corresponding to the first release area may be formed on the second surface.

The second release area may be an area that is sand-blast processed.

The surface roughness of the first and second release areas may be different from each other.

DETAILED DESCRIPTION OF CERTAIN INVENTIVE EMBODIMENTS

Figure 1:
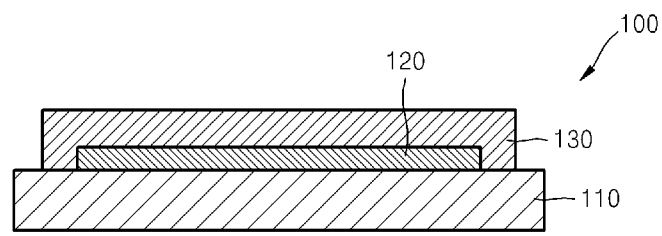
FIG. 1 is a cross-sectional view schematically illustrating a flexible display device according to an embodiment.

The attached drawings for illustrating embodiments are referred to in order to gain a sufficient understanding of the present disclosure, the merits thereof, and the objectives accomplished by the implementation of the present disclosure. Hereinafter, the present invention will be described in detail by explaining the embodiments with reference to the attached drawings. The same reference numerals in the drawings denote the same or like elements.

FIG. 1 is a cross-sectional view schematically illustrating a flexible display device 100 according to an embodiment. Referring to FIG. 1, the flexible display device 100 has a structure in which an ultra-thin type base substrate 110 having a thickness of about 50 μm to about 100 μm, a display unit 120 for forming an image, a sealing substrate 130 for sealing the display unit 120 are sequentially stacked. In other words, a flexible structure is embodied in which the display unit 120 is sealed by the base substrate 110 formed of a very thin glass material and the sealing substrate 130 formed of a thin film, instead of a conventional thick and hard glass substrate. Accordingly, the flexibility of a flexible display device is much increased compared to a conventional structure in which the display unit 120 is surrounded by a thick glass substrate. Thus, an image on a bent screen may be displayed.

The base substrate 110 is formed of a general glass material and only has only a thickness of about 50 μm to about 100 μm and thus exhibits a very high flexibility and transmissivity. The display unit 120 includes a thin film transistor (not shown), a light-emitting layer (not shown), etc. to produce an image.

The sealing substrate 130 is a layer having an anti-moisture property to prevent intrusion of external moisture and may include a thin film layer in which, for example, a multilayer film of SiO/SiN and transparent polyimide are stacked. Since the sealing substrate 130 is a thin film layer, the sealing substrate 130 merely has a thickness of about 1-10 μm.

Figure 2A:
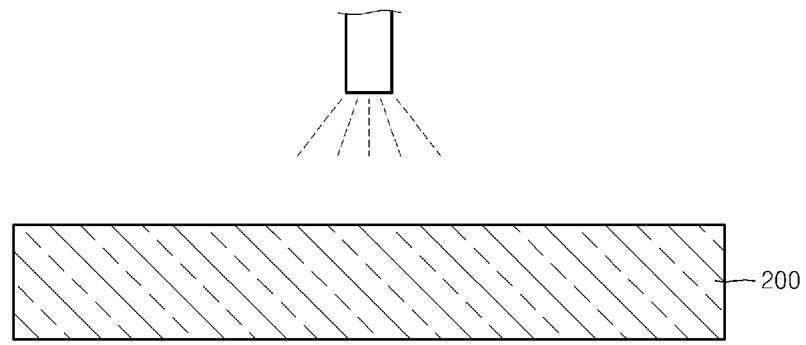
FIGS. 2A and 2B are cross-sectional views schematically illustrating a method of manufacturing a carrier substrate according to an embodiment.
Figure 2B:
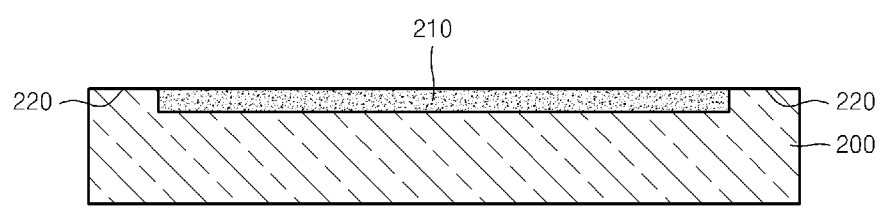
Figure 3A:
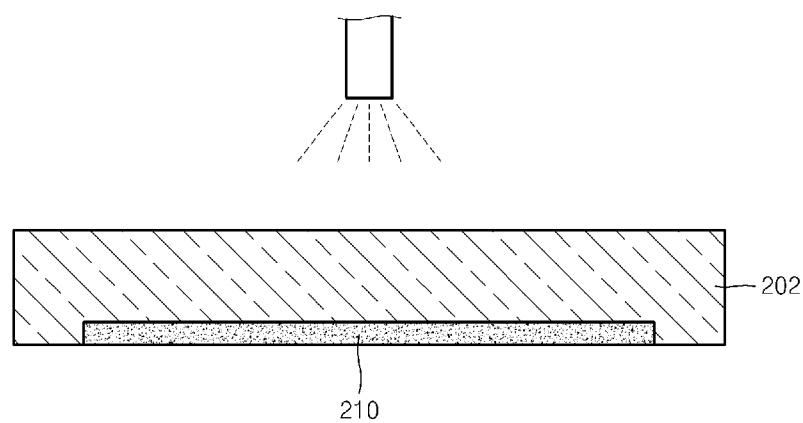
FIGS. 3A and 3B are cross-sectional views schematically illustrating a method of manufacturing a carrier substrate according to another embodiment.
Figure 3B:
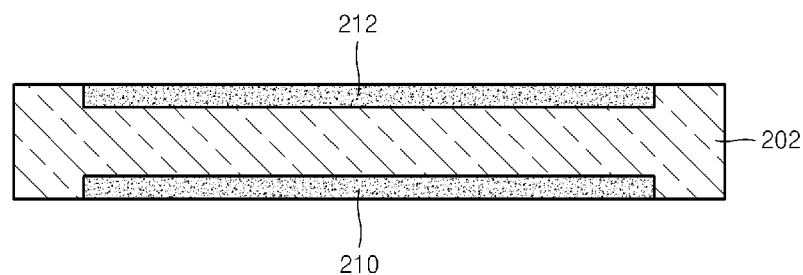

The flexible display device 100 configured as above may be manufactured by using a carrier substrate 200 of FIGS. 2A and 2B and a carrier substrate 202 of FIGS. 3A and 3B.

FIGS. 2A and 2B are cross-sectional views schematically illustrating a method of manufacturing a carrier substrate according to an embodiment. Referring to FIGS. 2A and 2B, in the method of manufacturing the carrier substrate 200, first, as illustrated in FIG. 2A, the carrier substrate 200 of a glass material is prepared, and a sand-blast process is performed on a first surface of the carrier substrate 200. The carrier substrate 200 of a glass material may be a substrate with a very flat surface having a surface roughness of about 0.2-0.3 nm.

In some embodiments, the sand-blast process is a process of blasting sand with a compressed air. After the sand-blasting process is performed, as illustrated in FIG. 2B, a first release area 210 where fine unevenness is formed and a first attachment area 220 that is not sand-blast processed around the first release area 210 may be formed on a first surface of the carrier substrate 200.

Because the first attachment area 220 is not shot-blast processed, a surface roughness of the first attachment area 220 is in a range of about 0.2-0.3 nm without change. However, the first release area 210 is in a relatively rough state due to the sand-blast process, compared to the first attachment area 220.

In some embodiments, a surface roughness of the first release area 210 is in a range of about 0.15-1.2 μm. When the surface roughness of the first release area 210 is higher than 1.2 μm, the carrier substrate 200 may be broken during the sand-blast process or a subsequent process. In contrast, when the surface roughness of the first release area 210 is lower than 0.15 μm, the base substrate 110 may be combined to the carrier substrate 200 since a release effect is negligible. Therefore, the first release area 210 is sand-blast processed to have a surface roughness in a range of about 0.15 μm to about 1.2 μm.

Also, although FIGS. 2A and 2B illustrate that only one first release area 210 is formed, the present disclosure is not limited thereto and a plurality of the first release areas 210 and a plurality of the first attachment areas 220 may be formed on the carrier substrate 200.

FIGS. 3A and 3B are cross-sectional views schematically illustrating a method of manufacturing a carrier substrate according to another embodiment. Referring to FIGS. 3A and 3B, a carrier substrate 202 may be manufactured by forming a second release area 212 by performing a sand-blast process again on a second surface of the carrier substrate 200 opposite to the first surface where the first release area 210 is formed.

The first release area 210 formed on the first surface may be formed the same as those described with reference to FIGS. 2A and 2B. In other words, the first release area 210 is formed to have a surface roughness of about 0.15 μm to about 1.2 μm by a sand-blast process.

In the process of forming the first release area 210, the carrier substrate 202 may be bent in a direction in which sand is blasted. Accordingly, when the carrier substrate 202 is bent, the ultra-thin type base substrate 110 of FIG. 1 attached to the carrier substrate 202 may be broken. As the second release area 212 is formed on the second surface, flatness of the carrier substrate 202 may be maintained.

For example, even when bending occurs during the forming of the first release area 210, because the second release area 212 corresponding to the first release area 210 is formed on the second surface by the sand-blast process, the bending occurring during the process of forming the first release area 210 is offset so that the flatness of the carrier substrate 202 may be maintained.

The second release area 212 is formed to restrict the bending of the carrier substrate 202. The surface roughness of the second release area 212 and the first release area 210 may be formed to be different from each other.

FIGS. 4A through 4E are cross-sectional views schematically illustrating a process of manufacturing the flexible display device of FIG. 1. The method of manufacturing a flexible display device by using the carrier substrate 200 of FIG. 2B is described below.

Figure 4A:
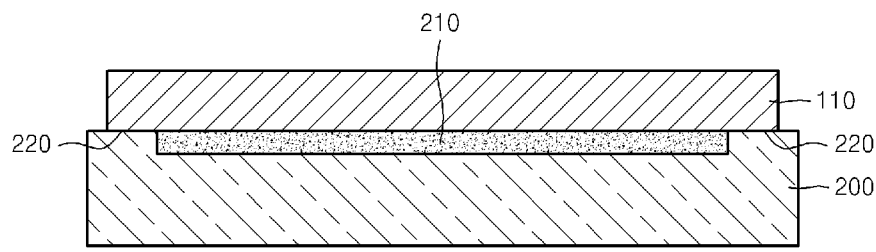
FIGS. 4A through 4E are cross-sectional views schematically illustrating a process of manufacturing the flexible display device of FIG. 1.

First, as illustrated in FIG. 4A, the carrier substrate 200 including the first release area 210 and the first attachment area 220 around the first release area 210 on the first surface is prepared. The base substrate 110 is attached to the first surface of the carrier substrate 200.

Although both of the carrier substrate 200 and the base substrate 110 are glass having a very flat surface of about 0.2 nm to about 0.3 nm, as described above, the first release area 210 of the carrier substrate 200 has a surface roughness of about 0.15 μm to about 1.2 μm by the sand-blast process.

Thus, as the base substrate 110 and the carrier substrate 200 both have a surface roughness of about 0.2 nm to about 0.3 nm and closely contact each other in the first attachment area 220, a van der Waals' force is generated and thus a firm combination is achieved between the base substrate 110 and the carrier substrate 200. In contrast, because the first release area 210 is in a rough state due to the sand-blast process, a van der Waals' force is not generated and thus the base substrate 110 and the carrier substrate 200 are not combined with each other. In this state, a thermal process is performed at a high temperature of about 250° C. or higher. As a result, in the first attachment area 220, a Si—O covalent bond is formed between the base substrate 110 and the carrier substrate 200 formed of a glass material and thus a firmer combination between the base substrate 110 and the carrier substrate 200 is achieved. However, in the first release area 210 where the distance between molecules is relatively large, the Si—O covalent bond is hardly formed between the substrates 110 and 200 and thus the base substrate 110 and the carrier substrate 200 are maintained in a non-combined state.

Figure 4B:
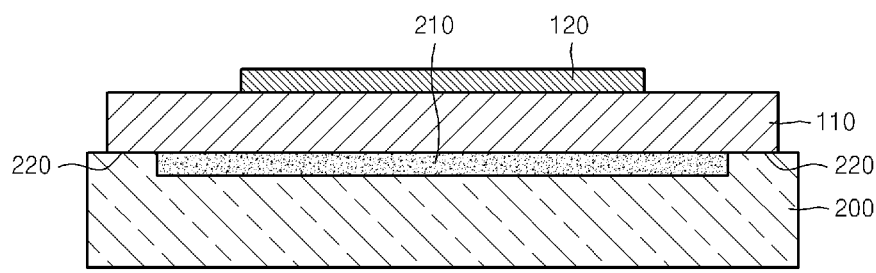

As such, after the base substrate 110 is combined with the carrier substrate 200, the display unit 120 is formed on the base substrate 110 as illustrated in FIG. 4B. The display unit 120 is formed in an area corresponding to the first release area 210 of the base substrate 110.

Figure 4C:
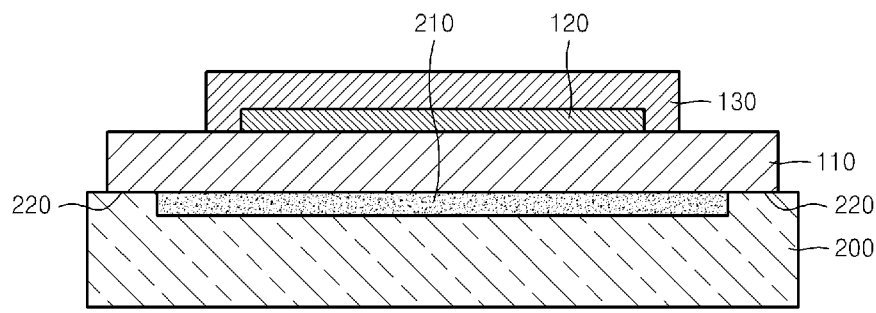
Figure 4D:
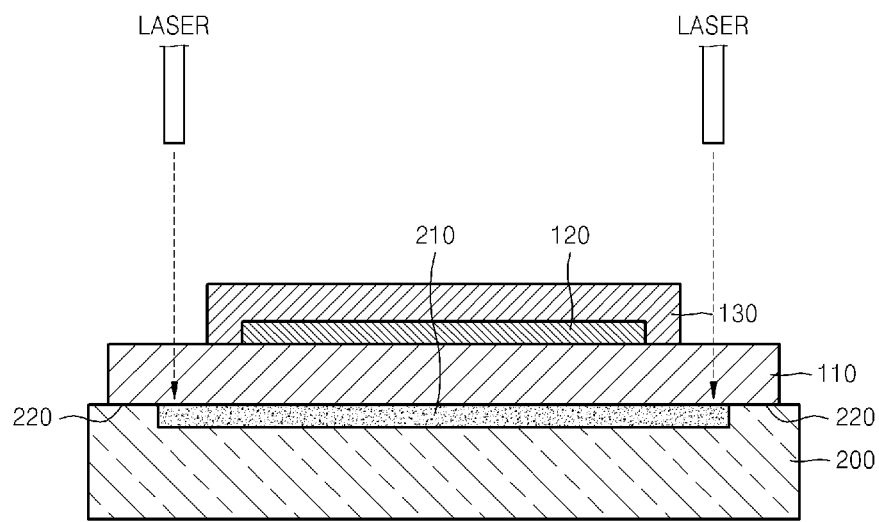

Next, as illustrated in FIG. 4C, the sealing substrate 130 is formed on the display unit 120 to hermetically seal the display unit 120. When a stack structure is formed by the above process, as illustrated in FIG. 4D, a laser beam is irradiated onto the base substrate 110 along an inner side of the first release area 210 of the carrier substrate 200. In other words, the base substrate 110 may be easily cut and separated from the carrier substrate 200 by irradiating a laser beam onto the base substrate 110 in a portion of the first release area 210 where the base substrate 110 and the carrier substrate 200 are not combined with each other.

Figure 4E:
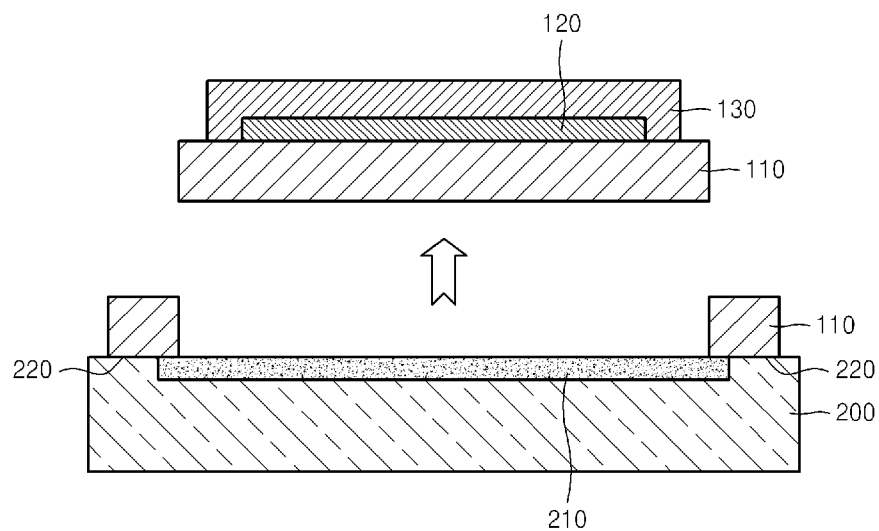

Then, the base substrate 110 is separated from the carrier substrate 200 as illustrated in FIG. 4E. In this state, when the carrier substrate 200 and the base substrate 110 are firmly combined with each other over the entire surface thereof, the base substrate 110 and the carrier substrate 200 are not easily separated from each other and thus a product may be damaged while the base substrate 110 is forcibly separated from the carrier substrate 200. In some embodiments, however, such a problem may be solved because the inner side of the first release area 210 where the base substrate 110 and the carrier substrate 200 are not combined with each other due to the sand-blast process is cut and separated.

As a result, the flexible display device 100 is manufactured, wherein the flexible display device 100 exhibits flexibility because the base substrate 110 and the sealing substrate 130 are flexible and can replace the conventional thick and hard glass substrate.

Also, as described above, when the base substrate 110 is attached to the carrier substrate 200 in the manufacturing process, the firm combination in the first attachment area 220 is used. During the separation process, the base substrate 110 is separated from the carrier substrate 200 by cutting a portion corresponding to the inner side of the first release area 210 that is not combined with the base substrate 110. Accordingly, the combination and separation processes may be smoothly performed and thus the rate of forming a defective product may be reduced.

In addition, when the first release area 210 that is not combined with the base substrate 110 is formed in the carrier substrate 200, the sand-blast process is used so that a separate mask deposition process is not needed, which reduces a work load.

In the above-described embodiment, the first release area 210 and first attachment area 220 are provided one for each. However, each of the first release area 210 and first attachment area 220 may be formed in plural numbers and the combination and separation processes may be performed for a plurality of the first release area 210 and first attachment area 220.

As described above, by using the carrier substrate and the manufacturing method, the combination and separation processes of the carrier substrate and the base substrate may be smoothly performed without a separate mask deposition process. Thus, damage of a product that may occur during the combination and separation processes of substrates may be much reduced.

In the method of manufacturing a flexible display device described with reference to FIGS. 4A to 4E, the carrier substrate 202 illustrated in FIG. 3B may be used. In the carrier substrate 202 illustrated in FIG. 3B, the first release area 210 is formed on the first surface and the second release area 212 corresponding to the first release area 210 is formed on the second surface that is the opposite to the first surface. In other words, even when bending is generated in the carrier substrate 202 during the sand-blast process to form the first release area 210, as the second release area 212 is formed by the sand-blast process, the bending generated in the carrier substrate 202 may be offset. Thus, the carrier substrate 202 may be maintained flat. Accordingly the carrier substrate 202 that is bent may be reused, thereby improving manufacturing yield. Furthermore, because the carrier substrate 202 may be maintained flat, the attachment process of the ultra-thin type base substrate 110 may be stably performed and the quality of the formed flexible display device 100 may be further improved.

The above embodiments are presented for illustrative purposes only, and are not intended to define meanings or limit the scope of the present invention as set forth in the following claims. Those skilled in the art will understand that various modifications and equivalent embodiments of the present invention are possible without departing from the spirit and scope of the present invention defined by the appended claims.

What is claimed is:

1. A method of manufacturing a flexible display device, the method comprising:
preparing a first release area and a first attachment area around the first release area on a first surface of a carrier substrate;
attaching a base substrate to the first surface;
forming a display unit, configured to generate an image, on the base substrate corresponding to the first release area of the carrier substrate;
cutting the base substrate around an area corresponding to the first release area of the carrier substrate, so as to include the display unit; and
separating the cut base substrate from the carrier substrate, wherein the first release area is formed by a sand-blast process.

2. The method of claim 1, wherein each of the base substrate and the carrier substrate comprises a glass material having a surface roughness of about 0.2 nm to about 0.3 mm.

3. The method of claim 2, wherein a surface roughness of the first release area is about 0.15 μm to about 1.2 μm by the sand-blast process.

4. A method of manufacturing a flexible display device, the method comprising:
preparing a first release area and a first attachment area around the first release area on a first surface of a carrier substrate;
attaching a base substrate to the first surface;
forming a display unit on the base substrate corresponding to the first release area of the carrier substrate;
cutting the base substrate around an area corresponding to the first release area of the carrier substrate, so as to include the display unit; and
separating the cut base substrate from the carrier substrate, wherein the attaching of the base substrate comprises:
combining the carrier substrate and the base substrate by a van der Waals' force in the first attachment area; and
combining the carrier substrate and the base substrate by inducing a covalent bond between the carrier substrate and the base substrate in the first attachment area through a thermal treatment.

5. The method of claim 4, wherein, after the base substrate is attached to the carrier substrate, the first release area is in a non-combined state with the base substrate.

6. The method of claim 1, further comprising sealing the display unit.

7. The method of claim 1, wherein, in the cutting of the base substrate, the base substrate is cut by irradiating a laser beam.

8. The method of claim 1, wherein, in the cutting of the base substrate, the base substrate is cut such that an edge of the base substrate is spaced apart from a boundary of the first release area toward the center of the first release area.

9. A method of manufacturing a flexible display device, the method comprising:
   preparing a first release area and a first attachment area around the first release area on a first surface of a carrier substrate;
   attaching a base substrate to the first surface;
   forming a display unit on the base substrate corresponding to the first release area of the carrier substrate;
   cutting the base substrate around an area corresponding to the first release area of the carrier substrate, so as to include the display unit; and
   separating the cut base substrate from the carrier substrate, wherein the carrier substrate comprises a second surface that is an opposite surface to the first surface, and a second release area corresponding to the first release area is formed on the second surface.

10. The method of claim 9, wherein the second release area is formed by a sand-blast process.

11. The method of claim 9, wherein the second release area and the first release area have different surface roughness.

12. The method of claim 1, further comprising forming a sealing unit over the display unit, wherein the sealing unit contacts the base substrate and the display unit.

* * * * *

UNITED STATES PATENT AND TRADEMARK OFFICE
CERTIFICATE OF CORRECTION

| | | |
|---|---|---|
| PATENT NO. | : 9,293,291 B2 | Page 1 of 1 |
| APPLICATION NO. | : 13/773277 | |
| DATED | : March 22, 2016 | |
| INVENTOR(S) | : Lee et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 69 days.

Signed and Sealed this
Twenty-sixth Day of July, 2016

Michelle K. Lee
*Director of the United States Patent and Trademark Office*